United States Patent [19]

Matsuki

[11] Patent Number: 5,751,058

[45] Date of Patent: May 12, 1998

[54] SEMICONDUCTOR DEVICE HAVING PARALLEL OVERLAPPING MAIN CURRENT TERMINALS

[75] Inventor: Masatoshi Matsuki, Tokyo, Japan

[73] Assignee: Mitsubishi Denki Kabushiki Kaisha, Tokyo, Japan

[21] Appl. No.: 635,767

[22] Filed: Apr. 22, 1996

[30] Foreign Application Priority Data

Oct. 25, 1995 [JP] Japan .................. 7-277587

[51] Int. Cl.$^6$ ...................... H01L 23/48
[52] U.S. Cl. ............ 257/692; 257/678; 257/687; 361/728
[58] Field of Search .................. 257/701, 678, 257/687, 692; 361/804, 728, 736, 772

[56] References Cited

U.S. PATENT DOCUMENTS

| | | | |
|---|---|---|---|
| 5,134,546 | 7/1992 | Izumi et al. | 361/395 |
| 5,408,383 | 4/1995 | Nagasaka et al. | 361/383 |
| 5,497,291 | 3/1996 | Hosen | 361/804 |

*Primary Examiner*—Jerome Jackson
*Assistant Examiner*—Nathan K. Kelley
*Attorney, Agent, or Firm*—Oblon, Spivak, McClelland, Maier & Neustadt, P.C.

[57] ABSTRACT

Main current terminals (31, 32) electrically coupled to main electrodes of IGBT elements (27) which are loaded on a power substrate (30) project from a side wall of a case (21) to the exterior. The main current terminals (31, 32), which are in the form of flat plates having the same plane contours in principal parts thereof, are arranged to be parallel to each other and overlap with each other. Thus, inductances of the main current terminals (31, 32) are suppressed. An insulating member (33) is interposed between the portions of the main current terminals (31, 32) outwardly projecting from the case (21), while outwardly extending from the plane contours of the main current terminals (31, 32). Therefore, a withstand voltage across these portions of the main current terminals (31, 32) is maintained at a high value. The interior of the case (21) is filled up with an electric insulating filler (43), whereby a withstand voltage across the remaining portions of the main current terminals (31, 32) which are stored in the case (21) is also maintained at a high value. Thus, a high withstand voltage across the main current terminals and reduction of the inductances are compatibly implemented.

15 Claims, 13 Drawing Sheets ns with the main
surface of the case.

SEMICONDUCTOR DEVICE HAVING PARALLEL OVERLAPPING MAIN CURRENT TERMINALS

BACKGROUND OF THE INVENTION

1. Field of the Invention

The present invention relates to a semiconductor device which is applicable to a power semiconductor device comprising a power switching element, and a method of fabricating the same, and more particularly, it relates to an improvement for compatibly implementing improvement of a withstand voltage across main current terminals and reduction of inductances.

2. Description of the Background Art

FIG. 14 is a front sectional view showing a conventional power semiconductor device. In this device, a metal base plate 2 serving as a heat slinger is fitted in the bottom portion of an electric insulating box-type case 1, so that a storage chamber 3 is defined by the case 1 and the metal base plate 2. Insulating substrates 4 are fixed to the upper surface of the metal plate 2, i.e., a major surface facing the storage chamber 3.

On the other hand, copper foil members (not shown) are formed on the lower surfaces of the insulating substrates 4, i.e., major surfaces facing the metal base plate 2, and these copper foil members are soldered to the metal base plate 2, thereby fixing the insulating substrates 4 to the metal base plate 2. Patterned copper foil members, i.e., wiring patterns 5, are formed on the upper surfaces of the insulating substrates 4, i.e., major surfaces which are opposite to those facing the metal base plate 2. Power switching elements (not shown) which are in the form of bare chips (semiconductor chips not molded with resin) is connected to the wiring patterns 5.

A pair of electric conductive main current terminals 6 and 7 are fixed to the case 1. The main current terminals 6 and 7 have upper end portions which are exposed to the exterior of the case 1, and lower end portions which are connected to the wiring patterns 5. The main current terminals 6 and 7 are electrically connected with main electrodes (such as emitter electrodes and collector electrodes of transistor elements, for example) of the power switching elements. In other words, the main current terminals 6 and 7 are adapted to relay the main electrodes of the power switching elements with the exterior. Therefore, a main current which is switched by the power switching elements flow through the pair of main current terminals 6 and 7.

The main current terminals 6 and 7 are inserted in a groove 8 which is defined in the upper surface of the case 1, and fixed to the case 1 by blocking the groove 8 with a lid 9. Principal parts of the main current terminals 6 and 7 excluding the upper end portions which are exposed to the exterior are stored in the storage chamber 3. The storage chamber 3 is filled up with an electric insulating filler 10, thereby protecting the power switching elements etc. in the storage chamber 3 and improving the withstand voltage across the pair of main current terminals 6 and 7.

A sufficient withstand voltage is attained since the storage chamber 3 is filled up with the filler 10, whereby the main current terminals 6 and 7 are arranged to be in parallel with and in proximity to each other in the storage chamber 3 excluding a portion close to the upper surface of the case 1. Thus, inductances parasitically developed in the main current terminals 6 and 7 are suppressed.

However, the upper end portions of the main current terminals 6 and 7 which are exposed to the exterior of the case 1 are fixed to the case 1 at a wide space, in order to guarantee a high withstand voltage across the same. Also in the storage chamber 3, therefore, the space between the main current terminals 6 and 7 must be widely set in the vicinity of the case 1. In other words, the space between the main current terminals 6 and 7 is widened in a portion close to the case 1, i.e., a portion 11 close to the upper end portion, and the inductances are disadvantageously increased in this portion.

When the main current terminals 6 and 7 serving as paths for the main current have high inductances, the main current cannot be switched at a high speed, and besides a high surge voltage is developed following the switching operation. Therefore, the main current terminals 6 and 7 having high inductances are unsuitable for a semiconductor device which switches a high main current at a high speed.

SUMMARY OF THE INVENTION

According to a first aspect of the present invention, a semiconductor device comprises a circuit substrate which is provided with wiring patterns along its major surface and loaded with a switching element having a pair of main electrodes, a case storing the circuit substrate, a pair of electric conductive main current terminals which are connected to the wiring patterns so that first and second ones of a pair of first end portions are electrically coupled to first and second ones of pair of main electrodes respectively and provided with a pair of second end portions projecting toward the exterior of the case; an electric insulating filler which is filled up in the interior of the case; and an electric insulating member for fixedly coupling the pair of main current terminals with each other while maintaining electric insulation therebetween, while the pair of main current terminals have the same plane contours in respective principal parts excluding the pair of first end portions and including the pair of second end portions, the insulating member fixedly couples the pair of main current terminals with each other so that the respective principal parts of the pair of main current terminals are parallel to each other and the plane contours thereof overlap with each other, the insulating member has an electric insulating flat plate type member which is inserted between the pair of second end portions projecting toward the exterior of the case along overall regions thereof, and the flat plate member extends toward the exterior of the plane contours along the overall regions.

According to a second aspect of the present invention, the insulating member consists of electric insulating resin which is integrally molded with the pair of main current terminals.

According to a third aspect of the present invention, the case is in the form of a box having upper, bottom and side surfaces, the circuit substrate is set in parallel with the bottom surface of the case, the respective principal parts of the pair of main current terminals are in the form of flat plates which are parallel to the bottom surface of the case, and the second end portions of the pair of main current terminals project toward the exterior from the side surface of the case.

According to a fourth aspect of the present invention, the case is formed by bonding a case upper part including the upper surface and a case lower part including the bottom surface to each other, and the pair of main current terminals are held between the case upper part and the case lower part along with the insulating member, whereby the pair of second end portions project toward the exterior from the side surface of the case.

According to a fifth aspect of the present invention, the pair of main current terminals have a pair of bent coupling parts coupling the respective principal parts and the pair of first end portions with each other respectively, first and second ones of the pair of coupling parts are respectively flush with first and second ones of the respective principal parts of the pair of main current terminals so that plane contours thereof overlap with each other, and the filler consists of a material not interfering with deformation of the coupling parts at least around the coupling parts.

According to a sixth aspect of the present invention, the pair of main current terminals have a pair of bent coupling parts coupling the respective principal parts and the pair of first end portions with each other respectively, and the filler consists of a material not interfering with deformation of the coupling parts at least around the coupling parts.

According to a seventh aspect of the present invention, a method of fabricating a semiconductor device comprises a step of preparing a circuit substrate which is provided with wiring patterns along its major surface, a case preparation step of forming two members capable of forming a case for storing the circuit substrate in the shape of a box having upper, bottom and side surfaces by being bonded to each other, i.e., a case upper part including the upper surface and a case lower part including the bottom surface, a terminal forming step of forming a pair of main current terminals by forming an electric conductive material into shapes having the same plane contours in respective principal parts excluding a pair of first end portions, a unit forming step of fixedly coupling the pair of main current terminals with each other through an insulating member so that the respective principal parts of the pair of main current terminals are parallel to each other and the plane contours overlap with each other while maintaining electric insulation between the pair of main current terminals thereby forming a terminal unit defined by the pair of main current terminals which are fixedly coupled with each other and the insulating member as the result, a step of fixing a switching element having a pair of main electrodes to the wiring patterns, thereby loading the switching element on the circuit substrate, a step of mounting the circuit substrate on the inner side of the case lower part, a bonding step of bonding the case upper part and the case lower part which is provided with the circuit substrate with each other while holding the terminal unit therebetween so that a pair of second end portions of the pair of main current terminals project toward the exterior of the case, thereby integrating the terminal unit into the case, a step of connecting first and second ones of the pair of first end portions to the wiring patterns to be electrically coupled to first and second ones of each pair of main electrodes of the switching element, respectively, after or simultaneously with the bonding step, and a filling step of filling the case with an electric insulating filler, while the insulating member is formed to have an electric insulating flat plate member which is interposed between the pair of second end portions to project toward the exterior of the case along overall regions thereof and extending toward the exterior of the plane contours along the overall regions.

According to an eighth aspect of the present invention, the unit forming step comprises a step of integrally forming the terminal unit by molding resin into the form of the insulating member while maintaining the pair of main current terminals in positional relation in the terminal unit to be formed.

In the device according to the first aspect of the present invention, the respective principal parts of the pair of main current terminals have the same plane contours and are so arranged in parallel to each other that the plane contours overlap with each other, whereby the inductances of the pair of main current terminals are suppressed. Across the pair of main current terminals, further, a high withstand voltage is guaranteed in the interior of the case due to the interposition of the electric insulating filler while a high withstand voltage is also guaranteed in the exterior of the case due to the interposition of the electric insulating plate type member extending toward the exterior from the plane contours of the portions projecting toward the exterior of the case. Namely, this device compatibly implements maintenance of a high withstand voltage and reduction of the inductances.

In the device according to the second aspect of the present invention, the insulating member for fixedly coupling the pair of main current terminals with each other consists of resin which is integrally molded with the pair of main current terminals, whereby the terminal unit which is a coupled body of the pair of main current terminals and the insulating member is easy to fabricate.

In the device according to the third aspect of the present invention, the second end portions of the pair of main current terminals project from the side surface of the box-type case while the circuit substrate is set in parallel with the bottom surface, whereby the device can be brought into a compact shape having a small total height. Further, the respective principal parts of the pair of main current terminals are in the form of simple flat plates, whereby the pair of main current terminals are easy to fabricate.

In the device according to the fourth aspect of the present invention, the case upper part and the case lower part are bonded to each other while holding the pair of main current terminals and the insulating member therebetween, whereby the structure of the second end portions of the pair of main current terminals projecting from the side surface of the case can be readily formed.

In the device according to the fifth aspect of the present invention, the respective principal parts and the respective first end portions of the pair of main current terminals are coupled with each other by the respective ones of the pair of bent coupling parts while the material not interfering with deformation of the coupling parts is filled up around the same, whereby heat distortion caused by heat generation of the switching elements etc. is absorbed by the coupling parts during the operation of the device. Consequently, concentration of thermal stress to the connecting portions between the pair of first end portions and the wiring patterns is eliminated or relaxed, whereby these portions are prevented from damage caused by thermal stress. Further, the pair of coupling parts are respectively flush with the principal parts of the pair of main current terminals and plane contours thereof overlap with each other, whereby the inductances are suppressed also in the coupling parts.

In the device according to the sixth aspect of the present invention, the respective principal parts and the respective first end portions of the pair of main current terminals are coupled with each other by the respective ones of the pair of bent coupling parts while the material not interfering with deformation of the coupling parts is filled up around the same, whereby heat distortion caused by heat generation of the switching elements etc. is absorbed by the coupling parts during the operation of the device. Consequently, concentration of thermal stress to the connecting portions between the pair of first end portions and the wiring patterns is eliminated or relaxed, whereby these portions are prevented from damage caused by thermal stress.

In the fabrication method according to the seventh aspect of the present invention, the terminal unit is so formed that the principal parts of the pair of main current terminals are parallel to each other and overlap with each other, whereby the inductances of the pair of main current terminals are reduced. Further, the case is filled up with the electric insulating filler, whereby a high withstand voltage is attained across the pair of main current terminals in the interior of the case. In addition, the electric insulating flat plate type member is interposed along the overall regions of the portions of the pair of main current terminals outwardly projecting from the case in the unit forming step while the flat plate type member is so formed as to extend toward the exterior of the plane contours along the overall regions, whereby a high withstand voltage can be attained across the pair of main current terminals also in the exterior of the case. Namely, a device compatibly implementing maintenance of a high withstand voltage and reduction of inductances is fabricated. Further, the case upper part and the case lower part are bonded to each other to hold the terminal unit therebetween in the bonding step, whereby the structure of the second end portions of the pair of main current terminals outwardly projecting from the case can be readily obtained.

In the fabrication method according to the eighth aspect of the present invention, the terminal unit is integrally formed by molding resin into the form of the insulating member while maintaining the pair of main current terminals in the positional relation in the terminal unit to be formed in the unit forming step, whereby the terminal unit is easy to fabricate.

An object of the present invention is to obtain a semiconductor device which is suitable for a high withstand voltage, a high current and high-speed switching by reducing inductances of main current terminals while ensuring a withstand voltage across the main current terminals, and a method suitable for fabrication of such a semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<1. Outline of Device Structure>

Figure 1:
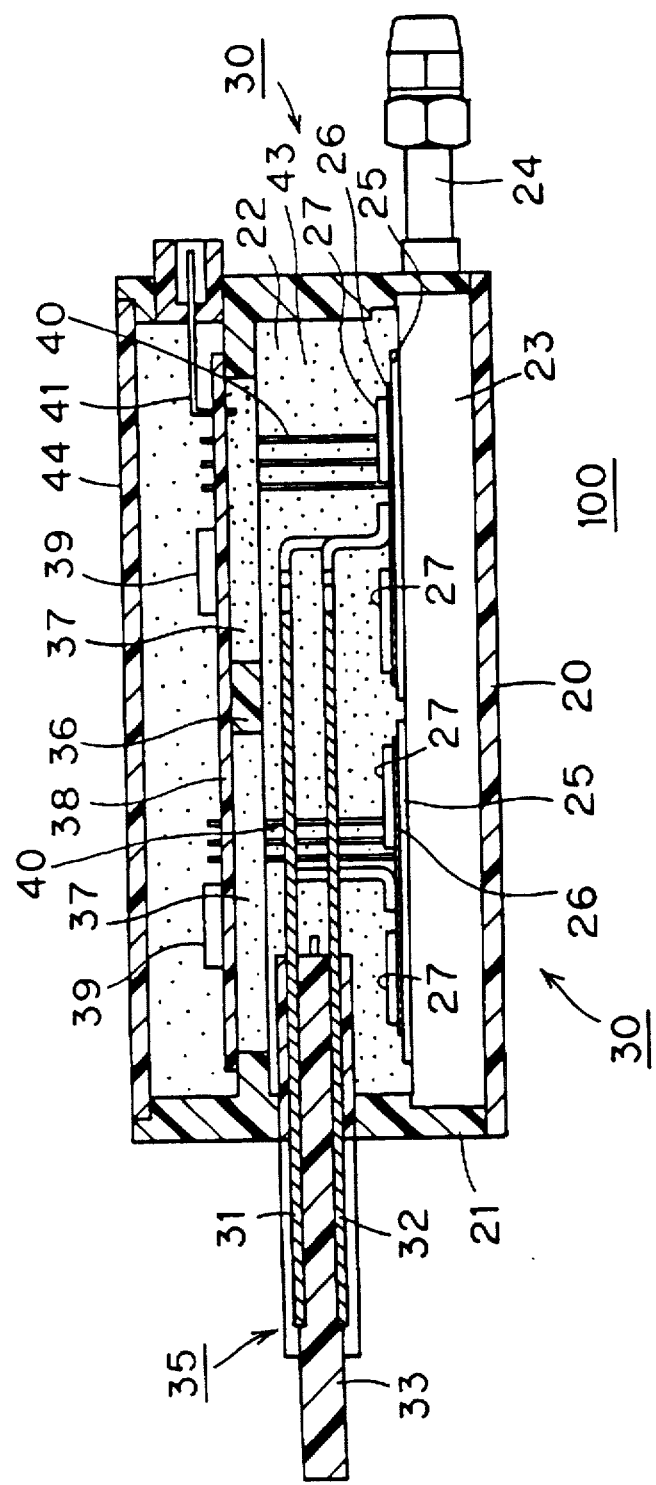
FIG. 1 is a side sectional view showing a semiconductor device according to an embodiment of the present invention.

FIG. 1 is a side sectional view showing a semiconductor device according to an embodiment of the present invention. This device 100 is formed as the so-called intelligent power module comprising power switching elements and control elements for controlling the same. Typical rated values thereof are at unprecedented values of a withstand voltage of 4.2 kV and a main current of 1200 A.

As shown in FIG. 1, the semiconductor device 100 is provided therein with a storage chamber 22 defined by an electric insulating box-type case 21 having a bottom plate 20 and an opening which is formed in its upper surface, i.e., a surface opposite to the bottom plate 20, and a lid 44 covering the upper surface. The case 21 is made of BMC (bulk molding compound) resin, for example. The BMC resin, which is a material prepared by mixing a filler, glass fiber and another additive to unsaturated polyester resin, is suitable for mold working with a mold due to its thermal setting property, and excellent in dimensional accuracy, mechanical strength, heat resistance and water resistance. In other words, the BMC resin is suitable as a material for the case 21 of the high power device 100.

A box-type cooling fin 23 for heat radiation is set on the upper surface of the bottom plate 20, i.e., a major surface facing the storage chamber 22. This cooling fin 23 is made of a heat conductive metal such as copper, while a labyrinthine passage (not shown) is formed in its interior for feeding a fluid such as water serving as a refrigerant. Further, inlet and outlet ports for the refrigerant are opened on side walls of the cooling fin 23, and a pair of plugs 24 (FIG. 1 shows only one of these plugs 24) are attached to these inlet and outlet ports to project from the side walls of the case 21 to the exterior, for enabling connection with an external device supplying the refrigerant.

A power substrate (circuit substrate) 30 is fixed on to the upper surface of the cooling fin 23. Copper foil members (not shown) are arranged on the lower surfaces of electric insulating substrate bodies (insulating substrates) 25 included by the power substrate 30, i.e., major surfaces which are facing the cooling fin 23, and these copper foil members are soldered to the cooling fin 23, thereby fixing the power substrate 30 onto the upper surface of the cooling fin 23.

Patterned copper foil members, i.e., wiring patterns 26, are formed on the upper surfaces of the substrate bodies 25, i.e., major surfaces which are opposite to those facing the cooling fin 23. Bare chip type IGBT elements 27 serving as power switching elements are fixed to the wiring patterns 26 by soldering. The substrate bodies 25 are preferably made of ceramics, which is excellent in heat resistance.

A pair of electric conductive main current terminals 31 and 32, which are fixed to each other through an insulating member 33, are fixed to a side wall of the case 21. Inner end portions (first end portions) of the main current terminals 31 and 32 are soldered to the wiring patterns 26, while outer end portions (second end portions) thereof are exposed to the exterior of the case 21.

The main current terminals 31 and 32 are electrically coupled to emitter electrodes and collector electrodes, which are main electrodes of the IGBT elements 27, through the wiring patterns 26 respectively, as described later. Namely, the main current terminals 31 and 32 are adapted to relay the main electrodes of the IGBT elements 27 with the exterior. Therefore, a main current which is switched by the IGBT elements 27 flows through the main current terminals 31 and 32.

A partition plate 36 is mounted on the inner side of the case 21, to divide the storage chamber 22 into upper and lower regions. The partition plate 36 is provided with an opening 37 for facilitating filling of a filler 43 described later, and the upper and lower regions communicate with each other through this opening 37. A control substrate 38 is fixed to the upper surface of the partition plate 36. Control elements 39 are loaded on the upper surface of the control substrate 38 having prescribed wiring patterns (not shown).

Further, relay pins 40 for electric connection with the wiring patterns 26 and a signal terminal 41 for electric connection with the exterior are connected to the control substrate 38. The relay pins 40 and the signal terminal 41 are connected to the control elements 39 through the control substrate 38. The signal terminal 41 passes through a side wall of the case 21, so that its outer end portion is exposed to the exterior.

The control elements 39 transmit gate signals through the relay pins 40 in response to an external signal which is inputted from the signal terminal 41, thereby implementing switching operations of the IGBT elements 27. Further, the control elements 39 are also adapted to protect the IGBT elements 27 by detecting abnormality such as an overheating or an overcurrent of the IGBT elements 27 through the relay pins 40 and emergently cutting off the IGBT elements 27.

The storage chamber 22 is filled up with the electric insulating filler 43, thereby protecting circuit parts such as the IGBT elements 27 which are stored in the storage chamber 22 against water and the like, while improving the withstand voltage across the pair of main current terminals 31 and 32. Since a sufficient withstand voltage is obtained due to the filler 43, the main current terminals 31 and 32 are arranged in the storage chamber 22 to be parallel to each other and to approach to each other. Thus, inductances which are parasitically developed in the main current terminals 6 and 7 are suppressed.

In portions of the main current terminals 31 and 32 projecting from the side wall of the case 21 toward the exterior, further, the main current terminals 31 and 32 are electrically insulated from each other by the insulating member 33 with a sufficient withstand voltage as described later, whereby the main current terminals 31 and 32 are arranged to be parallel to each other and to approach to each other also in these portions. Therefore, the inductances which are developed in the main current terminals 31 and 32 are reduced along the overall main current terminals 31 and 32. Namely, the inductances are further suppressed as compared with the main current terminals 6 and 7 provided in the conventional device, under the same withstand voltage.

The filler 43 is prepared from gel silicone resin, for example. Alternatively, the lower region provided under the partition plate 36 may be filled up with gel silicon resin, while the upper region may be filled up with epoxy resin. In this case, the lid 44 may not be provided. Alternatively, the overall storage chamber 22 may be filled up with insulating gas such as silicon hexafluoride ($SF_6$) or the like.

In the device 100, all members such as the main current terminals 31 and 32, the signal terminal 41 and the plugs 24 projecting from the case 21 toward the exterior are mounted on the side walls. Therefore, the device 100 is provided in a shape capable of coping with requirement for reduction in height and space saving.

<2. Structure of Terminal Unit>

The main current terminals 31 and 32 and the insulating member 33 fixedly coupling these terminals with each other while electrically insulating the same from each other form a terminal unit 35. A connector serving as an external device is detachably engaged with a portion of the terminal unit 35 projecting toward the exterior of the case 21. A pair of electrode plates which are provided on this connector are brought into pressure contact with the exposed surfaces of the main current terminals 31 and 32 respectively, thereby attaining electric connection.

Figure 2:
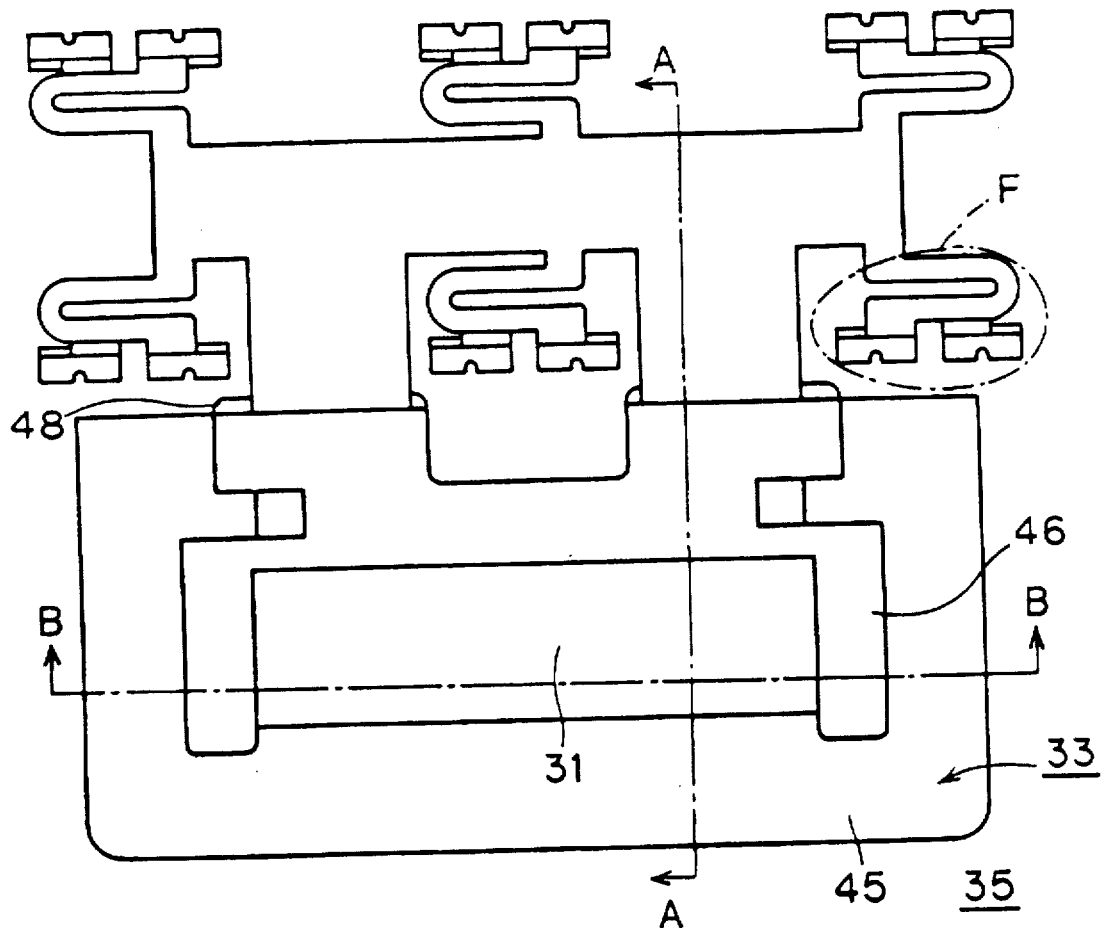
FIG. 2 is a plan view showing a terminal unit of the device shown in FIG. 1.
Figure 3:
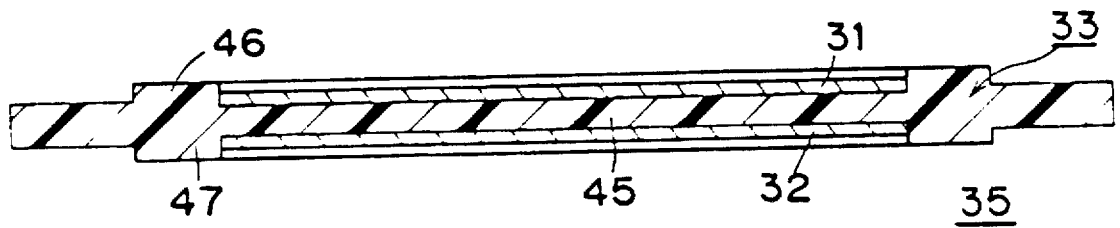
FIG. 3 is a sectional view of the terminal unit taken along the line B—B in FIG. 2.
Figure 4:
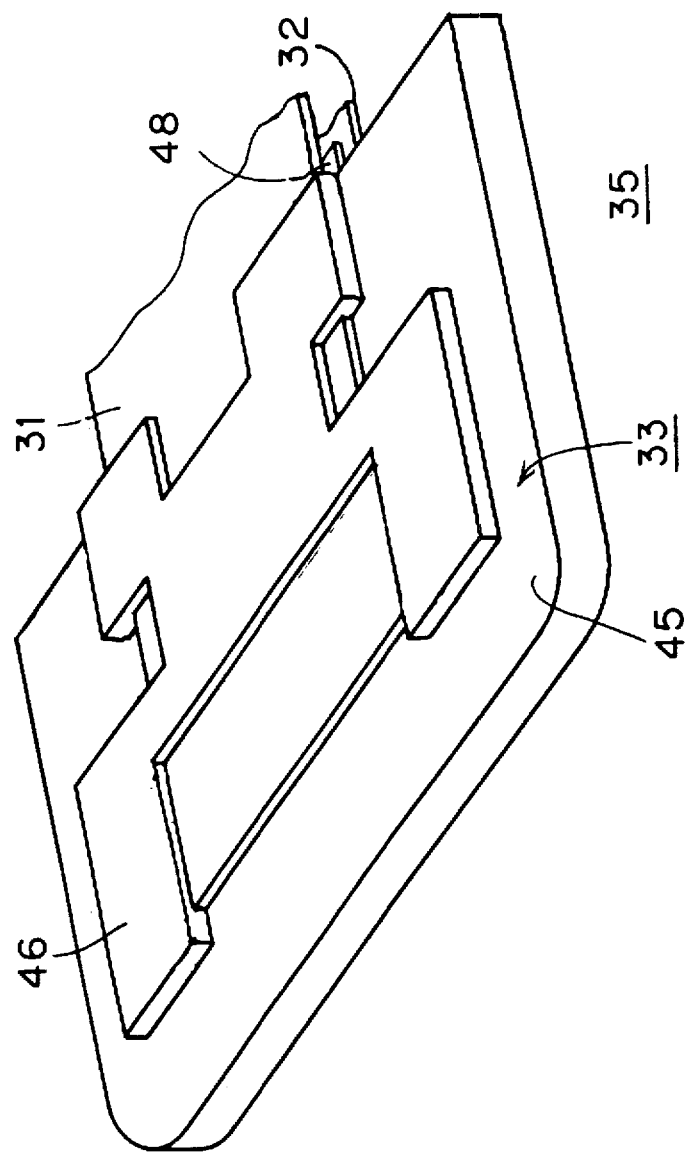
FIG. 4 is a partially fragmented perspective view of the terminal unit.
Figure 5:
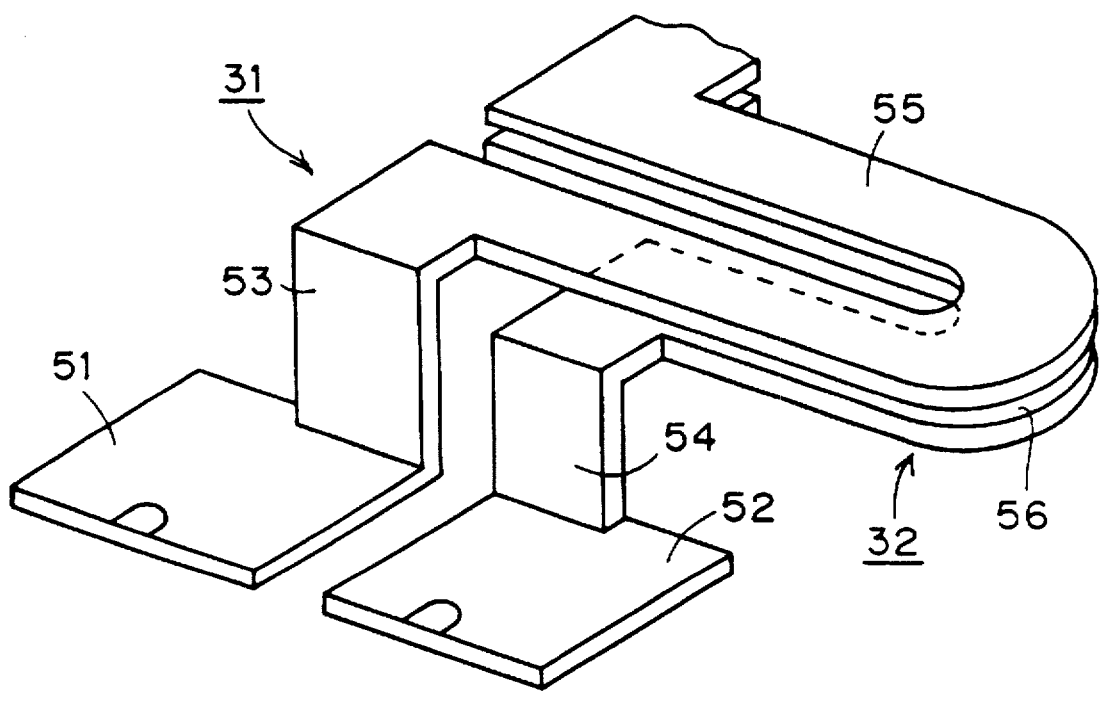
FIG. 5 is a perspective view showing a portion around the inner end portion of the terminal unit.

The structure of the terminal unit 35 is now described in detail. FIG. 2 is a plan view showing the terminal unit 35. A sectional structure of the terminal unit 35 along the line A—A in FIG. 2 is already drawn in FIG. 1. FIG. 3 is a sectional view taken along the line B—B in FIG. 2. Further, FIG. 4 is a partially fragmented perspective view of the terminal unit 35, and FIG. 5 is a perspective view showing a portion F around the inner end portion of the terminal unit 35 shown in FIG. 2.

As shown in FIGS. 2 to 5, the pair of main current terminals 31 and 32 are in the form of flat plates having the same plane contours in principal parts being all parts excluding the inner end potions which are fixed to the wiring patterns 26 and limited portions coupled thereto. The main current terminals 31 and 32 are electrically insulated from each other, and fixed to each other by the insulating member 33 so that the major surfaces thereof are parallel to each other and the plane contours thereof overlap with each other in the respective principal parts. The insulating member 33 fixes the main current terminals 31 and 32 in outer end portions projecting from the side wall of the case 21 toward the exterior and in the vicinity thereof.

The insulating member 33 has a flat plate member 45 which is interposed between the main current terminals 31 and 32 for electrically insulating the same from each other and maintaining the same in parallel positional relation, and a pair of holding members 46 and 47 which are integrally coupled with the flat plate member 45 while holding the main current terminals 31 and 32 and fixing the same to the flat plate member 45.

The terminal unit 35 is fixed to the case 21, to pass through not only the main current terminals 31 and 32 but the insulating member 33, as shown in FIG. 1. In other words, the main current terminals 31 and 32 are electrically insulated from each other by the flat plate member 45, not only in the exterior of the case 21 but in the vicinity of the case 21 in the storage chamber 22.

The plane contour of the flat plate member 45 is set to be positioned on the exterior of those of the main current terminals 31 and 32. In other words, the flat plate member 45 outwardly extends from the plane contours of the main current terminals 31 and 32, along the outer end portions thereof and portions close thereto. Thus, the creeping distance between the main current terminals 31 and 32 is increased, thereby maintaining a high withstand voltage across the same.

Preferably, a projection 48 is formed on an edge surface of the flat plate member 45 extending across the main current terminals 31 and 32, to extend along the edge surface. This projection 48 is adapted to increase the creeping distance between the main current terminals 31 and 32 along the edge surface, thereby further improving the withstand voltage across the main current terminals 31 and 32.

As shown in FIG. 5, the main current terminals 31 and 32 have U-shaped bent portions 55 and 56, projecting in the form of U shapes, which are flush with the principal parts in the portions stored in the storage chamber 22 respectively. Leg portions 53 and 54 which are bent perpendicularly to the forward ends of the U-shaped bent portions 55 and 56 are integrally coupled thereto respectively. Further, inner end portions 51 and 52 to be fixed to the wiring patterns 26 are integrally coupled to the forward ends of the leg portions 53 and 54.

In all portions of the main current terminals 31 and 32 excluding the inner end portions 51 and 52 and the leg portions 53 and 54 and including the U-shaped bent portions 55 and 56, the major surfaces are parallel to each other and the plane contours overlap with each other. Thus, the main current terminals 31 and 32 are so formed as to minimize the inductances.

The U-shaped bent portions 55 and 56, the leg portions 53 and 54 and the inner end portions 51 and 52 projecting from the flat plate type principal parts of the main current terminals 31 and 32 are provided in six portions in correspondence to portions connected to the wiring patterns 26 (see FIG. 2). The U-shaped bent portions 55 and 56 absorb heat distortion following heat generation during operation of the device 100, thereby eliminating or relaxing concentration of thermal stress to the connecting portions between the inner end portions 51 and 52 and the wiring patterns 26 and preventing the connecting portions from damage caused by thermal stress.

A material not interfering deformation of the U-shaped bent portions 55 and 56, such as gel silicone resin, for example, is selected as the filler 43 at least in a portion of the storage chamber 22 around the U-shaped bent portions 55 and 56, such as the region under the partition plate 36, for example, so that the U-shaped bent portions 55 and 56 can serve prescribed functions.

Electric conductive copper is most suitable as the material for the main current terminals 31 and 32. On the other hand, the material for the insulating member 33 is preferably prepared from epoxy resin, which is excellent in electric insulation and mechanical strength, enables mold working, guarantees voltage resistance since bubbles are hardly formed in the process of mold working, and is suitable for precise mold working.

In order to fabricate the terminal unit 35, the main current terminals 31 and 32 are first formed by punching a copper plate into the contours thereof and thereafter bending portions corresponding to the inner end portions 51 and 52 and the leg portions 53 and 54. Thereafter the main current terminals 31 and 32 are set in a prescribed mold in a state overlapping in parallel with each other at a constant space. Epoxy resin, for example, is injected into the mold and heated/hardened, thereby mold-working the insulating member 33 for fixedly coupling the main current terminals 31 and 32 with each other.

Thus, the flat plate member 45 and the holding members 46 and 47 are simultaneously formed as integrally coupled ones. Further, the main current terminals 31 and 32 are fixed to the insulating member 33 simultaneously with the mold working of the insulating member 33. Namely, the terminal unit 35 can be simply fabricated through press working of the copper plate and mold working of the insulating member 33. Further, a high degree of parallelism between the main current terminals 31 and 32 and precise overlapping of the plane contours thereof can be advantageously attained by a simple method.

<3. Structure of Integration of Terminal Unit in Case>

Figure 6:
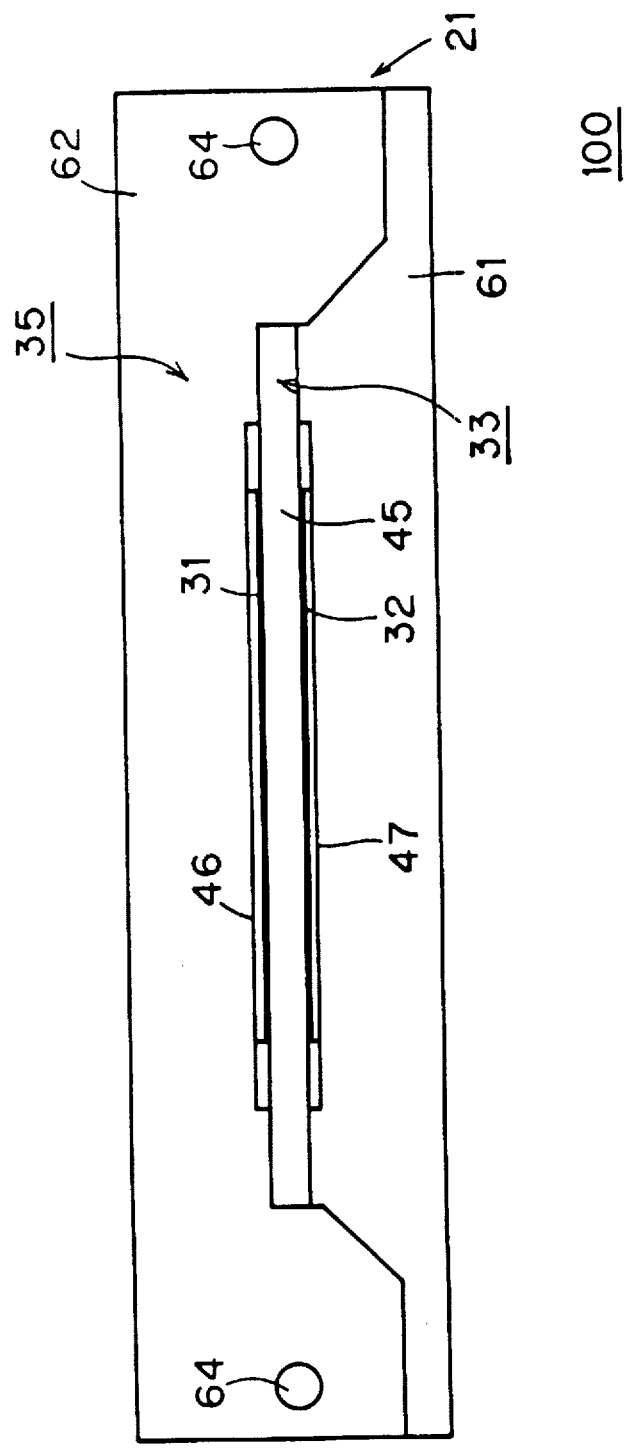
FIG. 6 is a front elevational view of the device shown in FIG. 1.

The structure of integration of the terminal unit 35 in the case 21 is now described. FIG. 6 is a front elevational view of the device 100. As shown in FIG. 6, the case 21 is formed by bonding a case lower part 61 having the bottom plate 20 and an open upper portion, and a frame-type case upper part 62 having open bottom and upper portions with each other. The case upper part 62 has the partition plate 36 (FIG. 1) in its interior.

The terminal unit 35 is inserted in a clearance which is defined between the case lower part 61 and the case upper part 62. In other words, the terminal unit 35 is held by the case lower part 61 and the case upper part 62, thereby passing through the case 21. The terminal unit 35, the case lower part 61 and the case upper part 62 are fixed to each other by an adhesive. Holes 64 are provided in the front side wall of the case upper part 62, for fixing the device 100 to an external device or an external connector which is engaged with the terminal unit 35 by screws.

Figure 7:
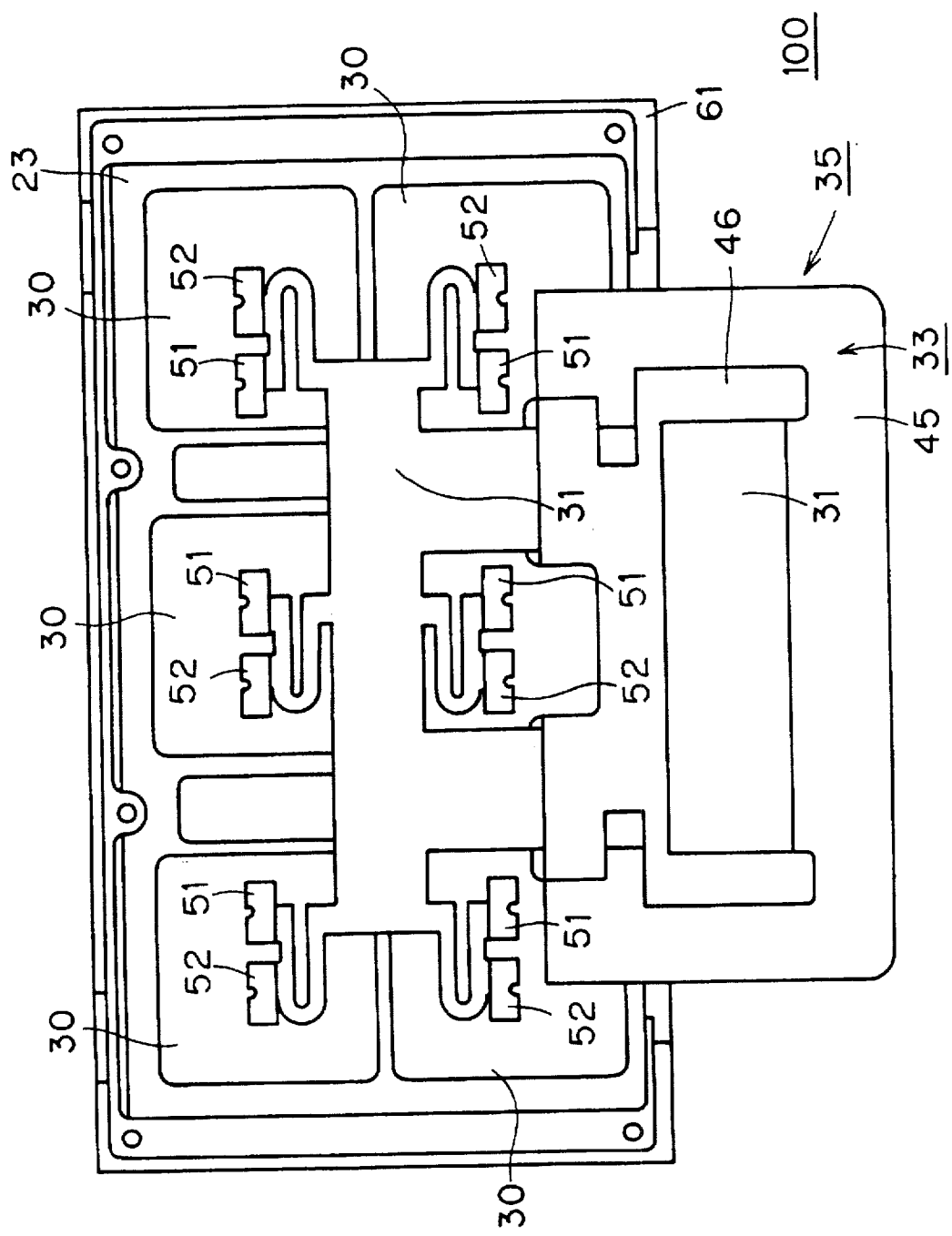
FIG. 7 is an exploded plan view of the device shown in FIG. 1.

FIG. 7 is a plan view of the device 100, from which the case upper part 62 is removed, showing such a state that power substrates 30 are set on the case lower part 61 and the terminal unit 35 is fixed to the case lower part 61 and the power substrates 30. As shown in FIG. 7, the terminal unit 35 is fixed to the upper edge of the side wall of the case lower part 61 on the insulating member 33. Further, the terminal unit 35 is fixed to prescribed portions of the six power substrates 30 which are arranged on the upper surface of the cooling fin 23 in the form of islands at the six pairs of inner end portions 51 and 52.

Figure 8:
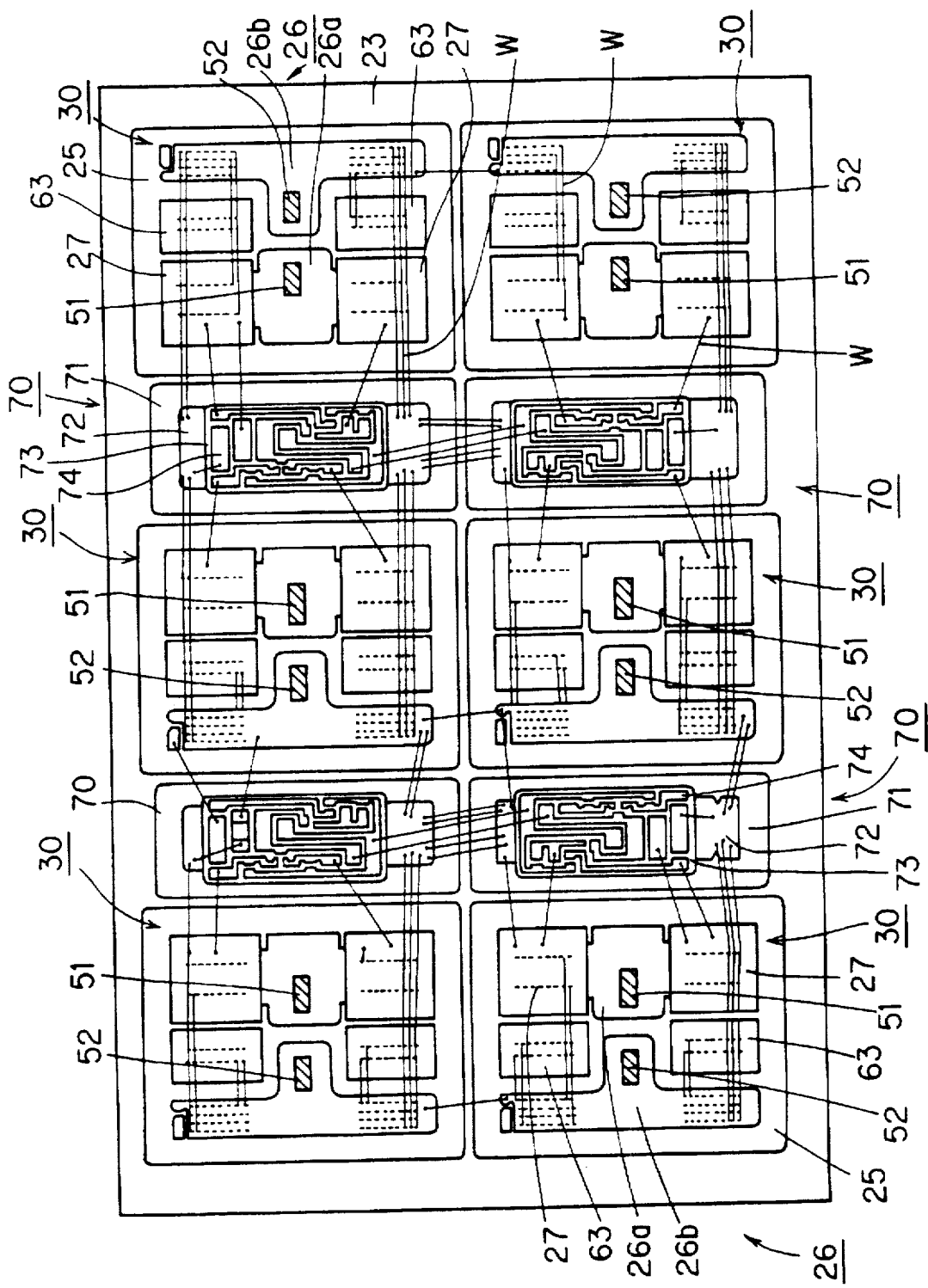
FIG. 8 is a plan view showing power substrates etc. of the device shown in FIG. 1.

FIG. 8 is a plan view showing the power substrates 30 which are arranged on the upper surface of the cooling fun 23 etc. Referring to FIG. 8, hatched rectangular portions show connecting portions with the inner end portions 51 and 52. The six power substrates 30 which are isolated from each other in the form of islands are arranged on the upper surface of the cooling fin 23. Two wiring patterns 26a and 26b, which are isolated from each other in the form of islands, forming the wiring patterns 26 are arranged on each power substrate 30.

Two bare chip type IGBT elements 27 and two bare chip type diodes 63 are fixed onto the wiring pattern 26a. Further, the inner end portions 51 and 52 are fixed to the wiring patterns 26a and 26b respectively.

Further, four relay substrates (circuit substrates) 70 are arranged on the upper surface of the cooling fin 23, to be adjacent to the power substrates 30. Similarly to the power substrates 30, the relay substrates 70 are fixed through copper foil members (not shown), which are formed on lower surfaces of substrate bodies 71 consisting of an electric insulating material such as ceramics and soldered to the upper surface of the cooling fin 23.

Copper foil members 72 are formed on the substrate bodies 71. Further, electric insulating plates 73 are fixed onto the copper foil members 72, to cover partial regions thereof. Patterned copper foil members, i.e., wiring patterns 74 are formed on the upper surfaces of the insulating plates 73. The lower end portions of the relay pins 40 (FIG. 1) are connected to the wiring patterns 74 by soldering. Further, the wiring patterns 26a, 26b and 74, the copper foil members 72, the IGBT elements 27 and the diodes 63 are properly electrically connected with each other by wires w.

Figure 9:
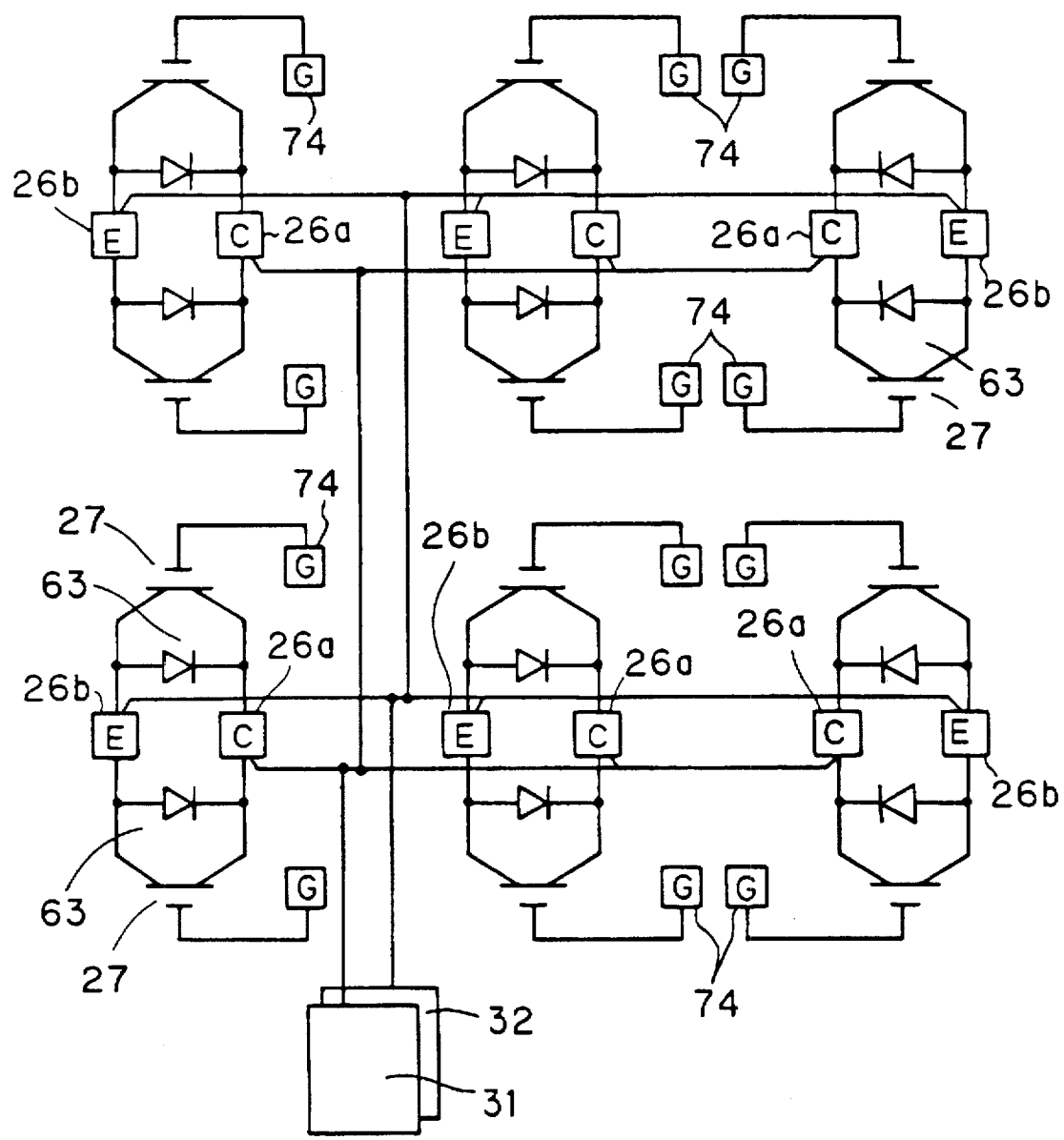
FIG. 9 is a circuit diagram of a principal part of a power circuit of the device shown in FIG. 1.

FIG. 9 is a circuit diagram showing circuits which are developed on the power substrates 30 and the relay substrates 70, i.e., power circuits including the IGBT elements 27. As shown in FIG. 9, collector electrodes C of the IGBT elements 27 are connected to the wiring patterns 26a which are connected with the main current terminal 31, while emitter electrodes E of the IGBT elements 27 are connected to the wiring patterns 26b which are connected with the main current terminal 32. Namely, 12 IGBT elements 27 are connected in parallel with each other between the pair of main current terminals 31 and 32.

The diodes 63 are connected in parallel with the respective ones of the IGBT elements 27. The diodes 63 have anode electrodes and cathode electrodes which are connected to the emitter electrodes E and the collector electrodes C of the IGBT elements 27 respectively. Therefore, the diodes 63 serve as freewheel diodes which are adapted to protect the IGBT elements 27.

Gate electrodes G of the IGBT elements 27 are connected to the wiring patterns 74 through the wires w. Sense electrodes (not shown) accompany the IGBT elements 27 for converting main currents thereof to voltage signals and outputting the same, and these sense electrodes are also connected to the wiring patterns 74 through the wires w.

Gate voltage signals which are transmitted from the control elements 39 (FIG. 1) are inputted to the gate electrodes G of the IGBT elements 27 through the relay pins 40, the wiring patterns 74 and the wires w. The IGBT elements 27 perform switching operations in response to the gate voltage signals which are inputted to the gate electrodes G. Namely, the collector electrodes C and the emitter electrodes E are turned on (conduct) and off (cut off) in response to the gate voltage signals. Consequently, a main current intermittently flows across the main current terminals 31 and 32.

<4. Method of Fabricating Device>

Figure 10:
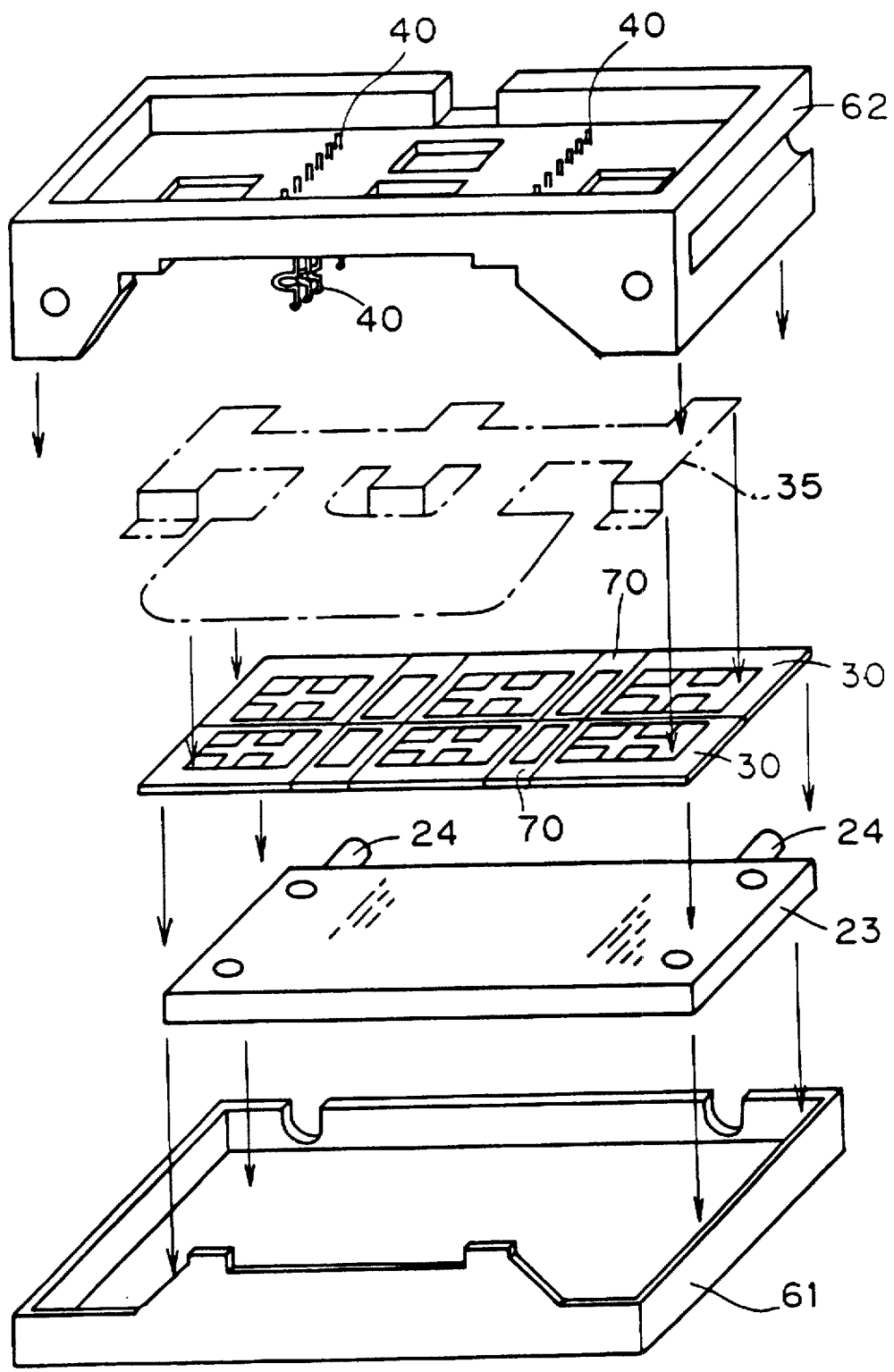
FIG. 10 is a fabrication step diagram of the device shown in FIG. 1.
Figure 11:
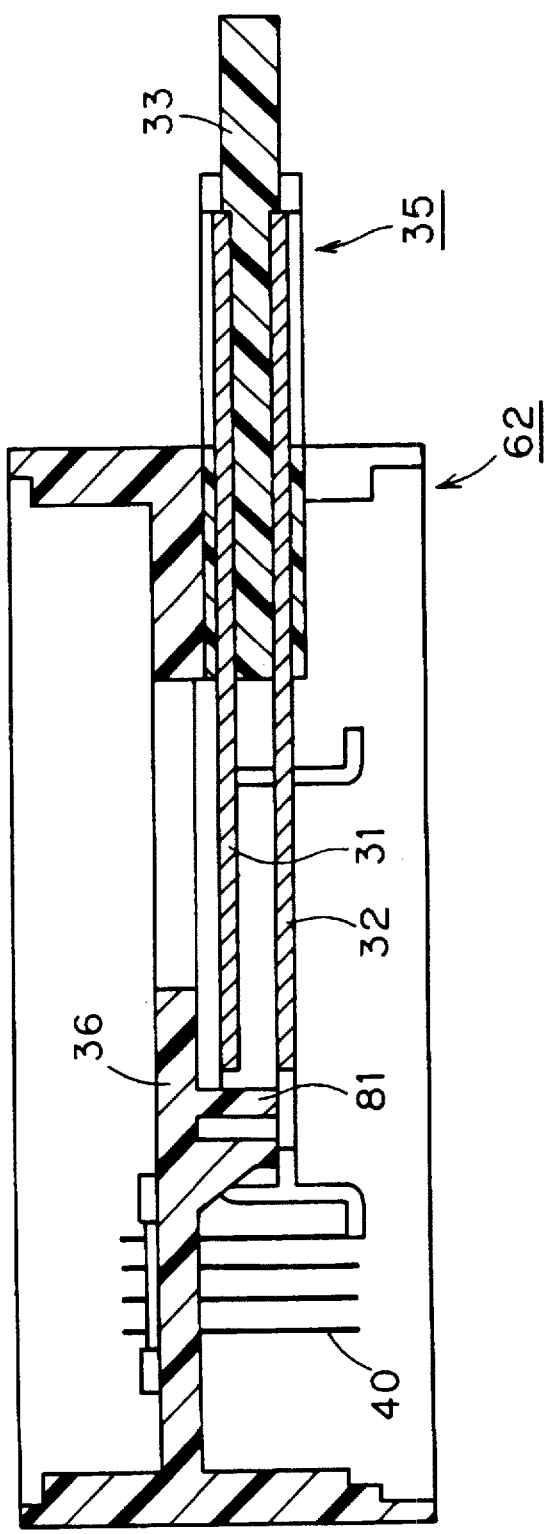
FIG. 11 is a fabrication step diagram of the device shown in FIG. 1.
Figure 12:
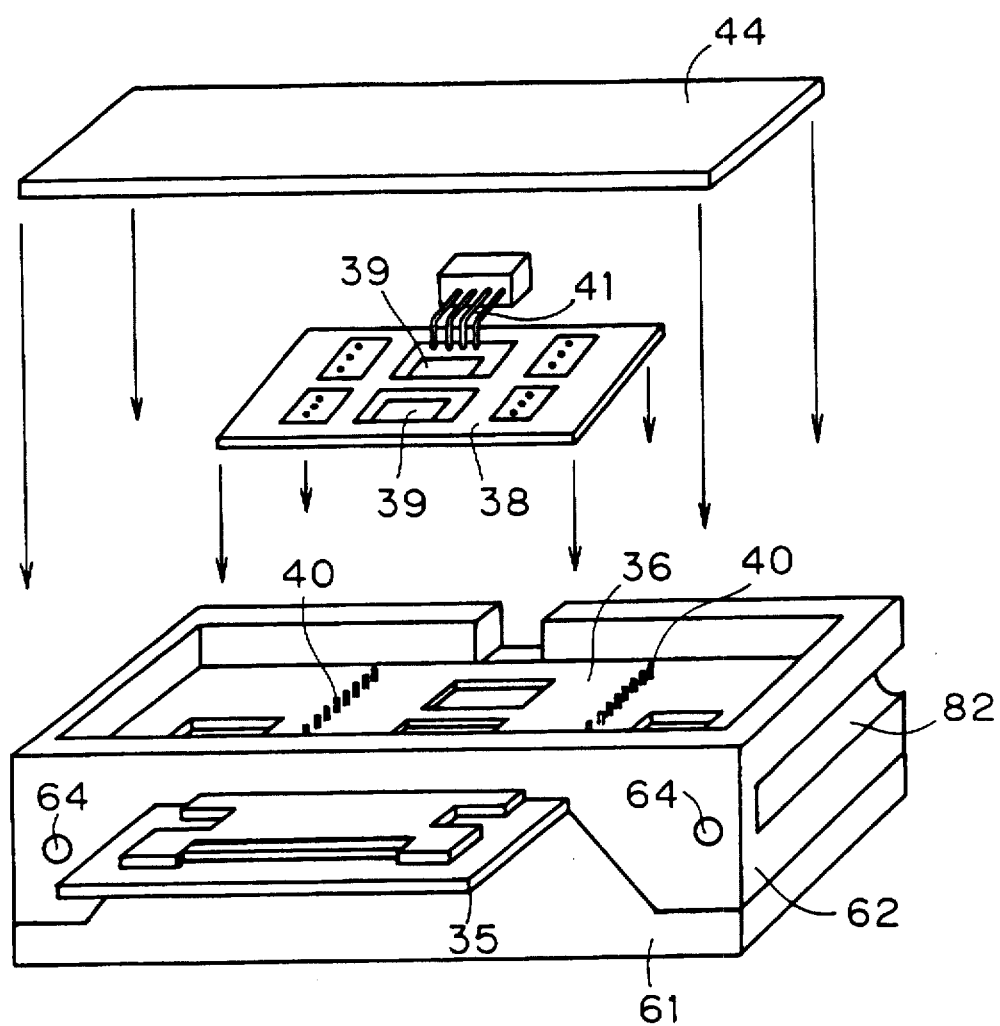
FIG. 12 is a fabrication step diagram of the device shown in FIG. 1.

A method of fabricating the device 100 is now described. FIGS. 10 to 12 illustrate fabrication steps for the device 100. In order to fabricate the device 100, the cooling fin 23 which is independently previously prepared is loaded on the case lower part 61 which is previously prepared by mold working, and fixed by screwing, as shown in FIG. 10. Thereafter the power substrates 30 and the relay substrates 70 are soldered onto the upper surface of the cooling fin 23.

The power substrates 30 and the relay substrates 70 are previously provided with the prescribed wiring patterns 26 and 74, and loaded with the semiconductor elements 27 and 63. Alternatively, the semiconductor elements 27 and 63 may be loaded after the power substrates 30 and the relay substrates 70 are fixed onto the upper surface of the cooling fin 23. After fixation of the power substrates 30 and the relay substrates 70 and loading of the semiconductor elements 27 and 63 are completed, bonding is carried out through the wires w (FIG. 8).

Thereafter or in parallel with the aforementioned step, the previously prepared terminal unit 35 is integrated into the previously prepared case upper part 62. FIG. 11 is a side sectional view showing the terminal unit 35 which is mounted on the case upper part 62. A boss 81 for fixing the terminal unit 35 is formed on a prescribed portion of the bottom surface of the partition plate 36 which is provided on the case upper part 62. A screw hole is formed in this boss 81.

A through hole which is formed in the main current terminal 32 is aligned with the screw hole and screwed thereto, whereby the terminal unit 35 is fixed to a prescribed position of the case upper part 62. At the same time, an adhesive is applied to a portion which comes into contact with the insulating member 33 in the side wall of the case upper part 62 or the bottom surface of the partition plate 36, and these portions which are in contact with each other are bonded/fixed to each other. The plurality of relay pins 40 are previously engaged in the partition plate 36. These relay pins 40 also have U-shaped bent portions, similarly to the main current terminals 31 and 32 (see FIG. 10).

Referring again to FIG. 10, the case upper part 62 and the case lower part 61 are bonded to each other after the bonding through the wires w is completed and integration of the terminal unit 35 in the case upper part 62 is completed. At this time, the inner end portions 51 and 52 of the main current terminals 31 and 32 are soldered with the wiring patterns 26a and 26b simultaneously with soldering of the lower end portions of the relay pins 40 and the wiring patterns 74 provided on the relay substrates 70.

The case lower part 61 and the case upper part 62 are bonded to each other through an adhesive. At this time, contact portions of the insulating member 33 of the terminal unit 35 and the case lower part 61 are also bonded to each other. Consequently, the case lower part 61, the terminal unit 35 and the case upper part 62 are integrated with each other, as shown in FIG. 12.

Thereafter the control substrate 38 which is previously connected with the control elements 39 and the signal terminal 41 is fixed to the upper surface of the partition plate 36 provided on the case upper part 62. At the same time, the upper end portions of the relay pins 40 projecting from the upper surface of the partition wall 36 are connected with the control substrate 38 by soldering.

Thereafter gel silicone resin, for example, is injected into the storage chamber 22 (FIG. 1) which is defined by the case lower part 61 and the case upper part 62. The partition plate 36 is provided with an opening, so that the silicone resin is readily injected into the portion under the partition plate 36 through the opening. When the silicone resin is injected until the resin surface reaches the partition plate 36, epoxy resin then is injected. After the epoxy resin is injected up to a portion close to the upper surface of the case upper part 62, the lid 44 is mounted to cover the upper surface of the case upper part 62. The injected epoxy resin is heated/hardened, thereby completing the device 100.

As shown in FIG. 12, elongated grooves 82 for guiding screws which are inserted in the holes 64 are formed on the side walls of the case upper part 62, for facilitating the insertion of the screws through the holes 64 which are provided on the front side wall of the case upper part 62. The holes 64 and the grooves 82 are simultaneously formed when the case upper part 62 is mold-worked.

As hereinabove described, the device 100 can be readily fabricated with no requirement for particularly complicated and difficult steps.

<5. Modifications>

(1) In the device 100, the terminal unit 35 is mounted to project from the side wall of the case 21 in the horizontal direction, i.e., the direction along the bottom surface. Thus, the device 100 can be brought into a flat form which is suitable for space saving. In a device which is employed under conditions requiring no space saving in particular, however, the terminal unit 35 may not necessarily project from the side wall of the case 21.

Figure 13:
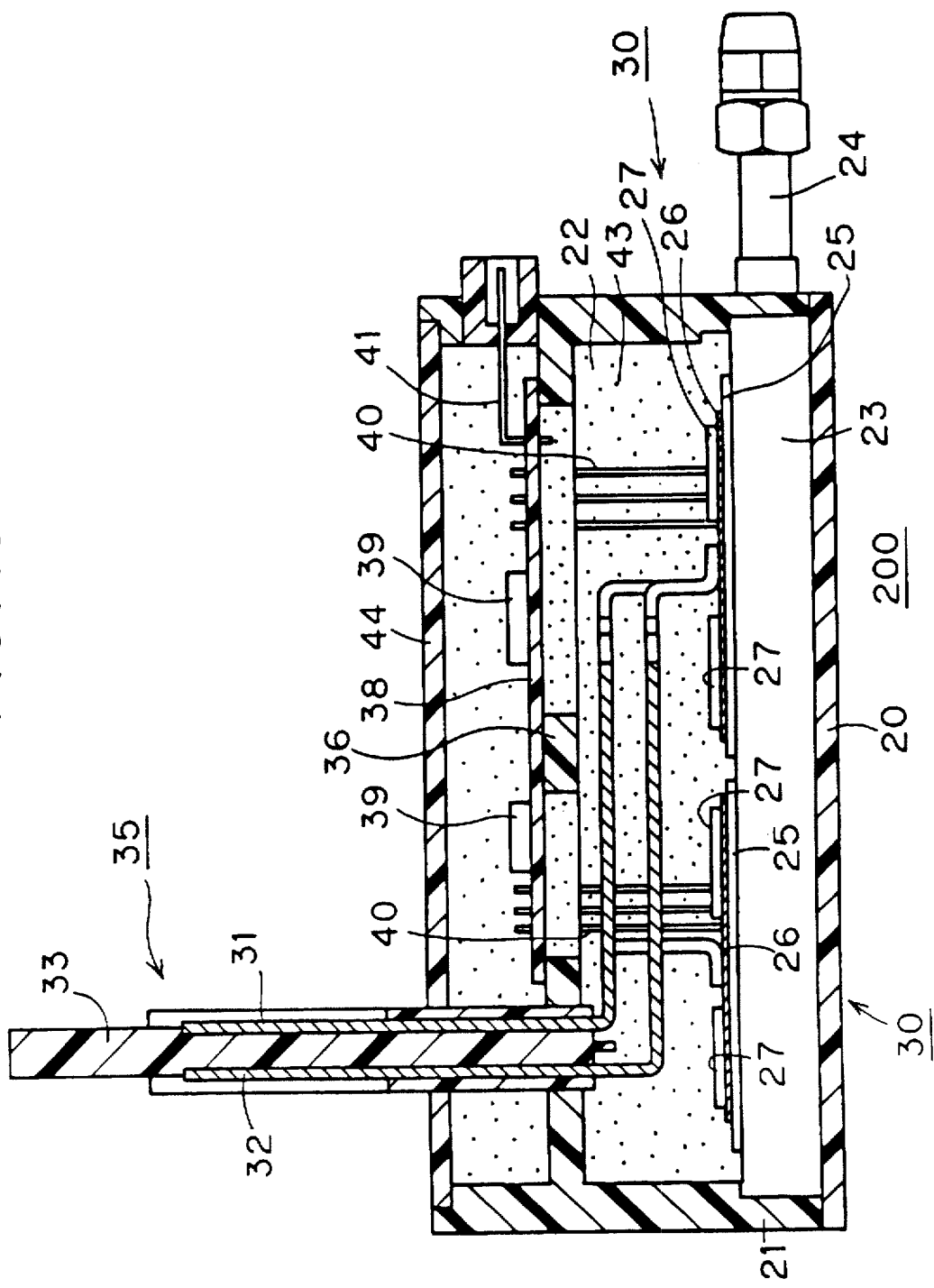
FIG. 13 is a side sectional view showing a semiconductor device according to a modification.

FIG. 13 shows an example of such a device 200. Referring to FIG. 13, portions identical or corresponding to those of the device 100 shown in FIG. 1 are denoted by the same reference numerals, to omit redundant description. In this device 200, a terminal unit 35 projects from a lid 44 vertically to the exterior, i.e., perpendicularly to a bottom plate 20 or the lid 44. Namely, main current terminals 31 and 32 are perpendicularly bent in portions below a partition plate 36 which is not fixed to an insulating member 33, while the upright insulating member 33 is fixed to the partition plate 36 and the lid 44, in place of the side wall of the case 21.

Also in this device 200, an effect of reducing inductances of the main current terminals 31 and 32 while maintaining a high withstand voltage across these terminals 31 and 32 can be attained similarly to the device 100.

Figure 14:
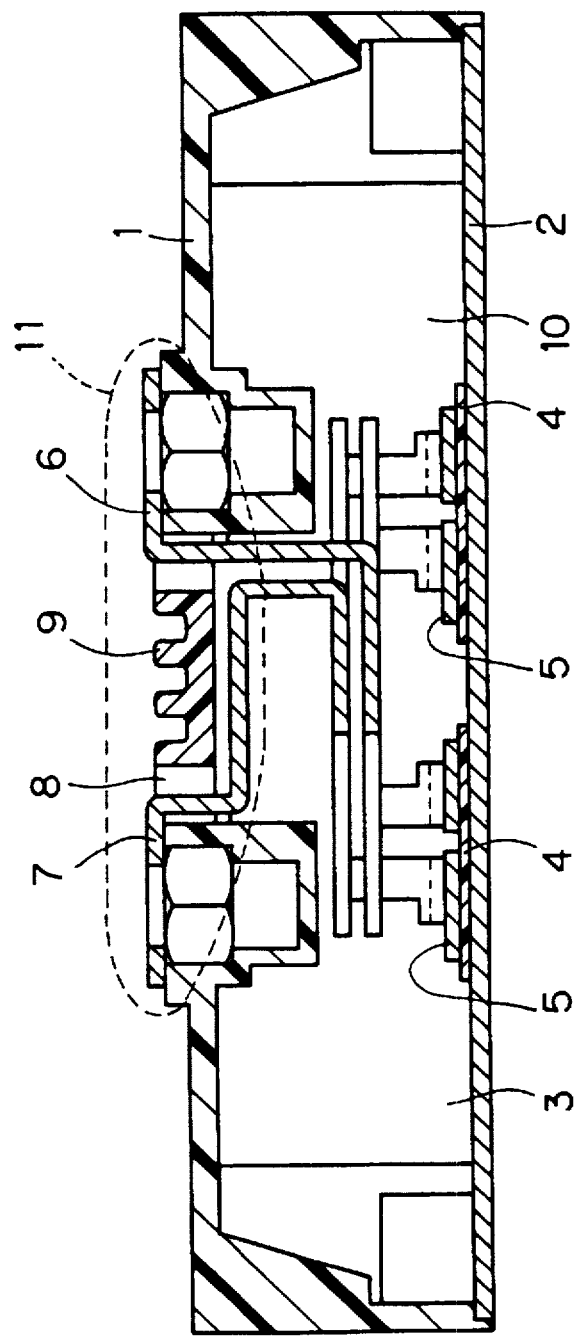
FIG. 14 is a front sectional view of a conventional semiconductor device.

(2) In each of the devices 100 and 200, the power substrates 30 and the relay substrates 70 developing power circuits are set on the cooling fin 23 circulating the refrigerant. In a device having a rated output which is lower than that of the aforementioned device, however, a metal base plate 2 may be employed in place of the cooling fin 23, similarly to the conventional device shown in FIG. 14. In this case, no bottom plate 20 is mounted on the case 21, and the bottom surface of the metal base plate 2 is exposed to the exterior.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a circuit substrate including wiring patterns along a major substrate surface and supporting a switching element having a pair of main electrodes coupled to the wiring patterns;
   a case holding said circuit substrate;
   a pair of electrically conductive main current terminals having a pair of first end portions inside the case adjacent to and electrically coupled with respective first and second ones of said pair of main electrodes and further having a pair of closely spaced parallel principal parts extending from respective ones of the first end portions, said closely spaced principal parts including a pair of respective closely spaced parallel second end portions projecting outside of said case, at least the pair of said closely spaced parallel principal parts of said pair of electrically conductive main current terminals having identical overlapping segments with plane contours;
   an electrically insulating material filling in spaces at least between and around said closely spaced parallel principal parts inside said case;
   an electrically insulating member having at least a supporting and separating flat plate segment located between said pair of closely spaced parallel second end portions maintaining electrical insulation therebetween, said flat plate segment extending from between said pair of closely spaced parallel second end portions all around the periphery thereof to improve the withstand voltage of the closely spaced parallel second end portions.

2. The semiconductor device in accordance with claim 1, wherein
   said insulating member comprises electric insulating resin integrally molded with said pair of main current terminals.

3. The semiconductor device in accordance with claim 1, wherein said case is in the form of a box having upper, bottom and side surfaces, said circuit substrate is in parallel with said bottom surface of said case, respective said principal parts of said pair of main current terminals are in the form of flat plates being parallel to said bottom surface of said case, and said second end portions of said pair of main current terminals project outside the case from said side surface of said case.

4. The semiconductor device in accordance with claim 3, wherein said case is formed by bonding a case upper part including said upper surface and a case lower part including said bottom surface to each other, and said pair of main current terminals are held between said case upper part and said case lower part along with said insulating member, whereby said pair of second end portions project outside the case from said side surface of said case.

5. The semiconductor device in accordance with claim 4, further comprising a control substrate supporting a control element for controlling said switching element, and said control substrate is contained in said case.

6. The semiconductor device in accordance with claim 5, wherein said control substrate is mounted on said case upper part to be parallel to said circuit substrate.

7. The semiconductor device in accordance with claim 6, wherein said case upper part has a partition plate on its inner side, and said control substrate is fixed onto said partition plate.

8. The semiconductor device in accordance with claim 7, wherein conductive relay pins are implanted in said partition plate, and first and second end portions of said relay pins are connected to said control substrate and said wiring patterns of said circuit substrate respectively, thereby electrically coupling said control element with said switching element.

9. The semiconductor device in accordance with claim 6, wherein a signal terminal mounted on said control substrate is electrically coupled with said control element and projects toward the exterior from a side surface of said case upper part.

10. The semiconductor device in accordance with claim 4, further comprising cooling means in contact with a major surface of said circuit substrate opposite the major substrate surface carrying said switching element.

11. The semiconductor device in accordance with claim 10, wherein said cooling means comprises a box-type cooling fin having a labyrinth shaped passage for holding a refrigerant in its interior.

12. The semiconductor device in accordance with claim 11, wherein said cooling fin comprises a pair of plugs being attached to inlet and outlet ports of said passage thereby enabling connection with an external device supplying said refrigerant, and said pair of plugs project toward the outside of the case from a side surface of said case lower part.

13. The semiconductor device in accordance with claim 10, wherein
- said cooling means has a heat conductive metal plate,
- an opening is formed in said bottom surface of said case lower part, and
- a major surface of said metal plate is opposite to said circuit substrate is exposed to the outside through said opening.

14. The semiconductor device in accordance with claim 3, wherein
- said pair of main current terminals have a pair of bent coupling parts coupling respective said principal parts and said pair of first end portions with each other respectively,
- first and second ones of said pair of coupling parts are respectively flush with first and second ones of said principal parts of said pair of main current terminals so that corresponds plane contours thereof overlap with each other, and
- said filler material does not interfere with deformation of said coupling parts at least around said coupling parts.

15. The semiconductor device in accordance with claim 1, wherein
- said pair of main current terminals have a pair of bent coupling parts coupling respective said principal parts and said pair of first end portions with each other respectively, and
- said filler consists of a material not interfering with deformation of said coupling parts at least around said coupling parts.

* * * * *